(12) United States Patent
Mizokami

(10) Patent No.: US 9,843,344 B2
(45) Date of Patent: Dec. 12, 2017

(54) DIGITAL VARIABLE CAPACITANCE CIRCUIT, RESONANT CIRCUIT, AMPLIFICATION CIRCUIT, AND TRANSMITTER

(71) Applicant: Renesas Electronics Corporation, Tokyo (JP)

(72) Inventor: Masakazu Mizokami, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/187,608

(22) Filed: Jun. 20, 2016

(65) Prior Publication Data
US 2017/0063405 A1    Mar. 2, 2017

(30) Foreign Application Priority Data
Aug. 26, 2015    (JP) .................. 2015-166736

(51) Int. Cl.
| | | |
|---|---|---|
| H04B 1/04 | (2006.01) | |
| H03H 11/32 | (2006.01) | |
| H03F 3/19 | (2006.01) | |
| H03H 11/48 | (2006.01) | |
| H03H 19/00 | (2006.01) | |
| H03F 3/24 | (2006.01) | |

(52) U.S. Cl.
CPC .............. *H04B 1/04* (2013.01); *H03F 3/19* (2013.01); *H03F 3/245* (2013.01); *H03H 11/481* (2013.01); *H03H 19/006* (2013.01); *H03F 2200/06* (2013.01); *H03F 2200/09* (2013.01); *H03F 2200/237* (2013.01); *H03F 2200/243* (2013.01); *H03F 2200/294* (2013.01); *H03F 2200/399* (2013.01); *H03F 2200/451* (2013.01); *H03H 11/32* (2013.01)

(58) Field of Classification Search
USPC ................................................. 330/301–302
See application file for complete search history.

(56) References Cited

U.S. PATENT DOCUMENTS

| | | | | |
|---|---|---|---|---|
| 6,327,463 B1 * | 12/2001 | Welland | ................. | H03B 21/02 331/36 C |
| 8,803,616 B2 * | 8/2014 | Zhang | ....................... | H03L 1/02 331/115 |

FOREIGN PATENT DOCUMENTS

JP         2007-149925 A      6/2007

\* cited by examiner

*Primary Examiner* — Hieu Nguyen
(74) *Attorney, Agent, or Firm* — McGinn IP Law Group, PLLC

(57) ABSTRACT

The present invention aims to provide a digital variable capacitance circuit, a resonant circuit, an amplification circuit, and a transmitter having a high performance. A digital variable capacitance circuit 50 according to this embodiment is a digital variable capacitance circuit including a plurality of unit capacity cells 51-0 to 51-$n$ connected in parallel between two output terminals OUTP and OUTN, in which the unit capacity cell 51 comprises: a first capacitor Cu1 having one end connected to one output terminal OUTP; a second capacitor Cu2 that is connected in series with the first capacitor Cu1 between the two output terminals; and an NMOS transistor M1 that is connected in parallel with the second capacitor Cu2 and is controlled in accordance with a digital control signal.

20 Claims, 14 Drawing Sheets

DIGITAL VARIABLE CAPACITANCE CIRCUIT, RESONANT CIRCUIT, AMPLIFICATION CIRCUIT, AND TRANSMITTER

CROSS-REFERENCE TO RELATED APPLICATIONS

This application is based upon and claims the benefit of priority from Japanese patent application No. 2015-166736, filed on Aug. 26, 2015, the disclosure of which is incorporated herein in its entirety by reference.

BACKGROUND

The present invention relates to a digital variable capacitance circuit, a resonant circuit, an amplification circuit, and a transmitter.

Japanese Unexamined Patent Application Publication No. 2007-149925 discloses a digital variable capacitance circuit that includes a plurality of capacity cells. A switching MOS transistor is connected in series to the ground side of each of the capacity cells. A P-channel MOS transistor that gives a high-level potential and an N-channel MOS transistor that gives a low-level potential are connected to the gate terminal of the switching MOS transistor. Since the potential level of the gate terminal of the switching MOS transistor becomes a low level, the resistance value of the variable resistance element is increased.

In the digital variable capacitance circuit disclosed in Japanese Unexamined Patent Application Publication No. 2007-149925, however, when a signal having a large voltage amplitude is supplied to an output terminal, a problem of a breakdown voltage or a leak current may occur.

The other problems of the related art and the novel characteristics of the present invention will be made apparent from the descriptions of the specification and the accompanying drawings.

SUMMARY

According to one embodiment, a digital variable capacitance circuit includes a plurality of capacity cells that are connected in parallel, in which each of the capacity cells includes a first capacitor having one end connected to one output terminal, an impedance element that is connected in series with the first capacitor between two output terminals, and a transistor that is connected in parallel with the impedance element and is controlled in accordance with a digital control signal.

According to the embodiment, it is possible to provide a digital variable capacitance circuit, a resonant circuit, an amplification circuit, and a transmitter having a high performance.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
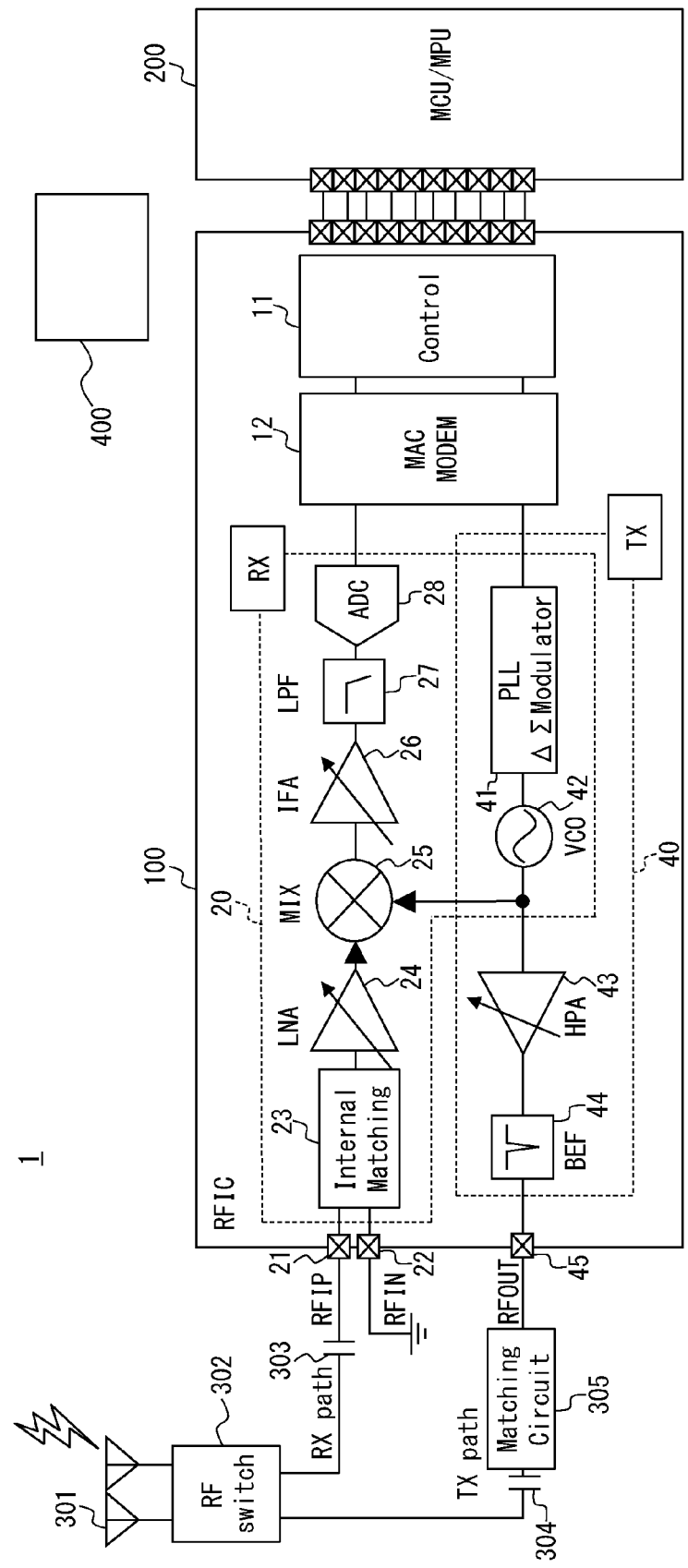
FIG. 1 is a diagram showing a configuration of a communication apparatus including a digital variable capacitance circuit.

For the clarification of the description, the following description and the drawings may be omitted or simplified as appropriate. Further, each element shown in the drawings as functional blocks that perform various processing can be formed of a CPU, a memory, and other circuits in hardware and may be implemented by programs loaded in the memory in software. Those skilled in the art will therefore understand that these functional blocks may be implemented in various ways by only hardware, only software, or the combination thereof without any limitation. Throughout the drawings, the same components are denoted by the same reference symbols and overlapping descriptions will be omitted as appropriate.

In recent years, a radio frequency integrated circuit (RFIC) that complies with low power consumption wireless communication standard Bluetooth (registered trademark) Low Energy (hereinafter it will be referred to as a BLE) for wearable products has been widely used. Further, the development of smart meter (power, gas) products has been focused on achieving an Internet of Things (IoT) society. In accordance therewith, the development of Sub-GHz RFIC that complies with IEEE 802.15.4 g has been advancing.

It is required that the RFICs that comply with the BLE and the Sub-GHz RFICs that comply with a gas meter, in particular, operate over a long period of time by the batteries thereof. Currently, RFIC products that are assumed to be driven by a lithium ion battery (about 3.0 V) having a high drive voltage are commercially available. However, lithium ion batteries are more expensive than other batteries and are less economical. In order to enhance economy, it is required to employ an alkaline battery (about 1.6 V) having a low drive voltage. As the trend where RFIC products that comply with the BLE or Sub-GHz are widely used continues in the future, a low voltage will become one of the key product requirements.

FIG. 1 shows a configuration example of a communication apparatus 1 according to this embodiment. FIG. 1 is a circuit diagram showing a configuration of the communication apparatus 1. The communication apparatus 1 includes an RFIC 100, a Micro Control Unit (MCU)/Micro Processing Unit (MPU) 200, an antenna 301, and a battery 400. The RFIC 100 is a Sub-GHz RFIC. Further, a digital variable capacitance circuit (hereinafter it will be also referred to as a variable capacitance circuit) according to this embodiment is used as the RFIC 100, as will be described later.

The MCU/MPU 200 generates data to be transmitted by the RFIC 100. Further, the MCU/MPU 200 executes processing in accordance with data demodulated by the RFIC. The MCU/MPU 200 is connected to the RFIC 100 via a predetermined interface.

The RFIC 100 is a Sub-GHz wireless communication apparatus. The RFIC 100 includes a controller 11, a MAC MODEM 12, a receiver 20, and a transmitter 40. The RFIC 100 further includes RF input terminals 21 and 22 and an RF output terminal 45.

The communication apparatus 1 includes the battery 400. That is, the communication apparatus 1 is driven by the battery 400. Therefore, the battery 400 supplies power to the RFIC 100, the MCU/MPU 200 and the like. The battery 400 is, for example, an alkaline battery.

The receiver 20 includes circuits of a radio receiving system (RX). Specifically, the receiver 20 includes an internal matching circuit 23, an LNA circuit 24, a mixer 25, an IFA circuit 26, a low-pass filter (LPF) 27, an Analog to Digital (A/D) converter 28, a Voltage Control Oscillator (VCO) circuit 42, and a Phased Locked Loop (PLL) circuit 41.

The transmitter 40 includes circuits of a radio transmitting system (TX). Specifically, the transmitter 40 includes the PLL circuit 41, the VCO circuit 42, an HPA circuit 43, and a band reject filter 44. The PLL circuit 41 and the VCO circuit 42 are shared by the receiver 20 and the transmitter 40.

The antenna 301 transmits a high-frequency signal to a space as radio waves and receives radio waves from the space as a high-frequency signal in order to perform radio communications. The RFIC 100 performs processing of the reception signal received by the antenna 301 and the transmission signal transmitted from the antenna 301. This processing will be described later.

The RFIC 100 is connected to the antenna 301 via a transmission path TX path and a reception path RX path. Specifically, a capacitor 303 is provided in the reception path RX path. The reception signal received by the antenna 301 is input to the RF input terminal 21 via the capacitor 303. Further, the RF input terminal 22 is connected to the ground.

A capacitor 304 and a matching circuit 305 are provided in the transmission path TX path. The transmission signal generated by the RFIC 100 is supplied to the antenna 301 via the matching circuit 305 and the capacitor 304. Further, an RF switch 302 is provided between the antenna 301 and the RFIC 100. The RF switch 302 switches the transmission path (TX Path) and the reception path (RX Path) of the high-frequency signal.

A description will now be given of the transmission processing. An instruction to transmit data is output to the RFIC 100 from the MCU/MPU 200. Then the controller 11 executes signal processing to RFIC-control the instruction from the MCU/MPU 200. The MAC MODEM 12 then generates transmission signal data. The PLL circuit 41 and the VCO circuit 42 modulate the transmission signal data and a carrier wave. For example, the transmission signal data is $\Delta\Sigma$ modulated and the modulated data is transmitted on the carrier wave. The VCO circuit 42 then outputs the transmission signal that has been modulated to the HPA circuit 43.

The HPA circuit 43 amplifies the transmission signal modulated by the PLL circuit 41 and the VCO circuit 42 and outputs the amplified signal to the band reject filter 44. The transmission power is therefore amplified. The band reject filter 44 removes unnecessary band components of the transmission signal. The transmission signal that has passed the band reject filter 44 is input to the RF output terminal 45.

The transmission signal from the RF output terminal 45 is supplied to the RF switch 302 via the matching circuit 305 and the capacitor 304. The matching circuit 305 matches the impedance to propagate a high-power transmission signal output from the HPA circuit 43 to the antenna 301 without loss. When transmission is performed, the RF switch 302 connects the antenna 301 and the RF input terminal 21 via the transmission path TX Path. The transmission signal from the RFIC 100 is therefore supplied to the antenna 301. The antenna 301 emits an electromagnetic wave in accordance with the transmission signal. It is thus possible to transmit data by radio.

Next, a description will be given of the reception processing. When the antenna 301 receives the radio waves, the reception signal in accordance with the radio waves that the antenna 301 has received is propagated through the reception path RX path. That is, the reception signal is input to the RF input terminal 21 via the capacitor 303. The internal matching circuit 23 is arranged just before the LNA circuit 24. The internal matching circuit 23 performs impedance matching. It is therefore possible to supply power from the antenna 301 without loss. The Low Noise Amplifier (LNA) circuit 24 is a first-stage amplifier of the receiving system and amplifies the reception signal received by the antenna 301.

The mixer 25 demodulates the reception signal received by the antenna. That is, the mixer 25 extracts data that has been transmitted on the carrier wave from the high-frequency signal. The mixer 25 then outputs the current in accordance with the data that has been extracted to the IFA circuit 26. The mixer 25 performs demodulation processing using a local signal output from the VCO circuit 42. The local signal is a signal having a frequency the same as that of the carrier wave of the high-frequency signal.

An Intermediate Frequency Amplifier (IFA) circuit is, for example, a transimpedance amplifier. The IFA circuit 26 performs a current-voltage conversion of the output current from the mixer 25. That is, since the output of the mixer 25 is a current and the input of the LPF 27 is a voltage, the IFA circuit 26 performs the current-voltage conversion.

The LPF 27 suppresses components other than a desired wave included in the reception signal from the antenna 301. That is, the reception signal also includes, in addition to the desired wave, a disturbing signal that is unnecessary for the reception. The LPF 27 allows only the low-band frequency to pass therethrough, whereby the disturbing signal is suppressed. The A/D converter 28 A/D converts the reception signal that has passed the LPF 27. Since the MAC MODEM 12 is a digital signal processing circuit, the A/D converter 28 generates a digital reception signal and outputs the generated signal to the MAC MODEM 12.

Figure 2:
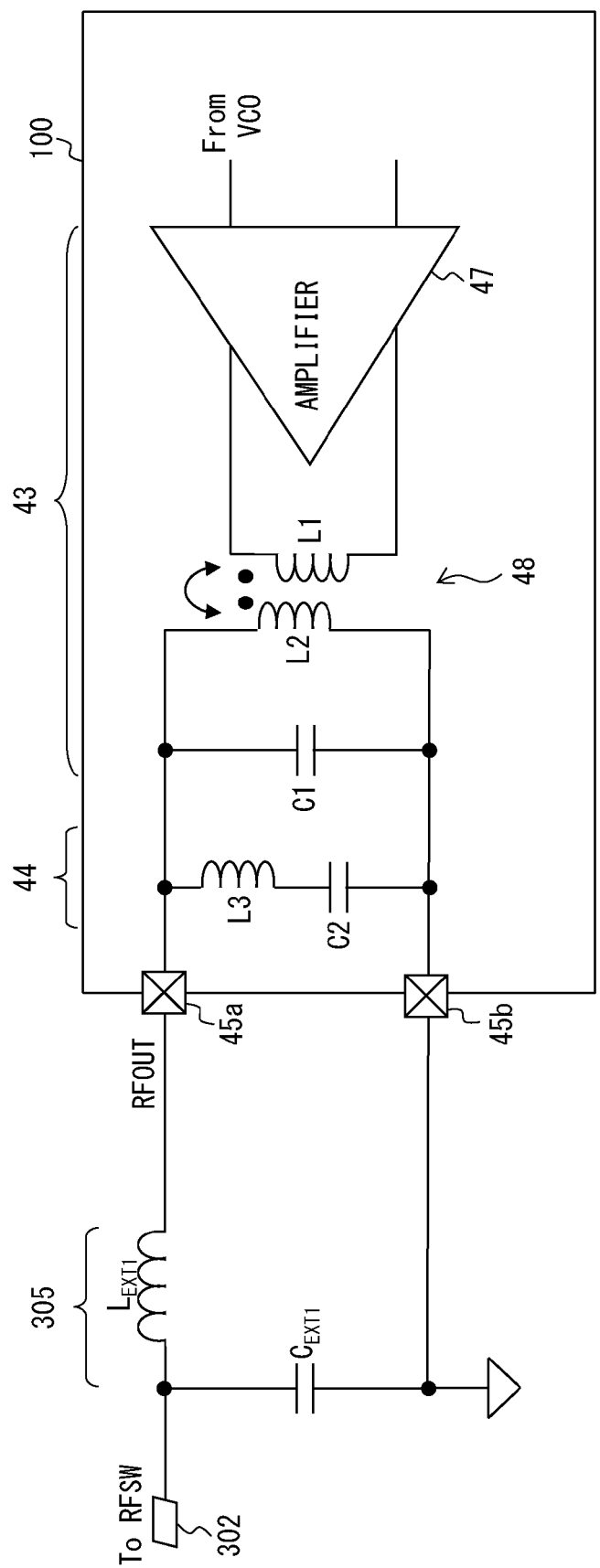
FIG. 2 is a circuit diagram showing a configuration of an HPA circuit used in the communication apparatus.

Enhancements in the efficiency and the power output of the HPA circuit 43 can be achieved when a balun and the capacitor are resonating in parallel. The capacitor needs to have a variable function in order to comply with the communication standard of each country. FIG. 2 shows a circuit configuration example of the HPA circuit 43 and the band reject filter 44.

The HPA circuit 43 includes an amplifier 47, a balun 48, and a capacitor C1. In the balun (balanced-unbalanced converter) 48, an inductor L1 and an inductor L2 are coupled to each other. The band reject filter 44 includes a capacitor C2 and an inductor L3. The inductor L2 and the capacitor C1 are parallel resonant circuits. Further, the capacitor C2 and the inductor L3 are serial resonant circuits. The inductors L1 and L2 and the capacitor C1 are balun resonant circuits. The matching circuit 305 includes an external capacitor $C_{EXT1}$ and an external inductor $L_{EXT1}$.

The transmission signal output from the VCO circuit 42 is input to the amplifier 47. The amplifier 47 amplifies the transmission signal and outputs the amplified signal to the balun 48. The balun 48 converts a differential signal from the amplifier 47 into a single end signal. In the balun 48, the inductor L2 and the inductor L1 are coupled to each other. The inductor L2 and the capacitor C1 are parallel resonant circuits. Therefore, the transmission signal input to the balun 48 is output at low loss.

The capacitor C1 and the inductor L2 are connected in parallel between an RF output terminal 45a and an RF output terminal 45b. That is, one end of the capacitor C1 is connected to the RF output terminal 45a and the other end thereof is connected to the RF output terminal 45b. One end of the inductor L2 is connected to the RF output terminal 45a and the other end thereof is connected to the RF output terminal 45b.

Further, the band reject filter 44 is connected in parallel with the capacitor C1 between the RF output terminal 45a and the RF output terminal 45b. The inductor L3 and the capacitor C2 are connected in series between the RF output terminal 45a and the RF output terminal 45b. Specifically, one end of the inductor L3 is connected to the RF output terminal 45a and the other end thereof is connected to one end of the capacitor C2. The other end of the capacitor C2 is connected to the RF output terminal 45b.

Further, in the outside of the RFIC 100, the matching circuit 305 is arranged between the RF output terminal 45a and the RF output terminal 45b. The RF output terminal 45a is connected to the RF switch 302 via the external inductor $L_{EXT1}$. The RF output terminal 45b is connected to the ground. One end of the external inductor $L_{EXT1}$ is connected to the RF output terminal 45a and the other end thereof is connected to one end of the external capacitor $C_{EXT1}$. The other end of the external capacitor $C_{EXT1}$ is connected to the ground and the RF output terminal 45b.

By resonating the inductor L2 and the capacitor C1 in parallel, the attenuation rate in the balun 48 becomes minimum in a resonance frequency. It is therefore possible to improve efficiency and power output. Since the frequency band of the resonance frequency defined varies among countries, it is required to provide a function of adjusting the frequency band of the resonance frequency. The resonance frequency is adjusted by making the capacitor variable. That is, by employing a variable capacitor as the capacitor C1, the communication apparatus 1 can be used in various countries. It is therefore possible to employ the variable capacitance circuit according to this embodiment as the capacitor C1.

On the other hand, when the transmission power is high, the voltage amplitude on the RFIC end (e.g., RF output terminal 45a) increases, which may cause a malfunction of the variable capacitance circuit. In a low power supply voltage operation, in particular, the problem of the above malfunction becomes more serious. In the following description, an example in which the RFIC 100 shown in FIG. 1 is used in Japan will be discussed.

According to ARIB STD-T108, the maximum transmission power on the end of the antenna 301 is defined to be 13 dBm or smaller. When there is a loss of 2.5 dB in the RF switch 302, the output power needs to be equal to or smaller than 15.5 dBm in the RF output terminal 45 of the RFIC 100. Since it is desired to increase the distance from a meter to a concentrator in a smart meter network, it is required to increase the transmission output as much as possible. Therefore, it is required that the maximum transmission output in the RFIC 100 be 15.5 dBm. When the transmission power is denoted by Pout and the impedance on the end of RFOUT in FIG. 2 is denoted by $Z_{RFOUT}$, the voltage amplitude $V_{RFOUT}$ on the end of RFOUT is expressed by the following Expression (1).

$$V_{RFOUT} = \sqrt{10^{Pout[dBm]/10} \times 1\text{mW} \times Z_{RFOUT}} \qquad (1)$$

Consider a case, for example, in which the output power is 15.5 dBm and the impedance on the end of RFOUT is 100 ohms. At this time, the voltage amplitude on the end of RFOUT is 1.88 V peak voltage from Expression (1). When the transmission output is 15.5 dBm, the voltage amplitude on the end of RFIC becomes extremely large. An increase in the voltage amplitude may lead to a malfunction of the variable capacitance circuit that forms the capacitor C1 or the capacitor C2. In the low power supply voltage operation, the problem of the malfunction of the variable capacitance circuit becomes more serious. In this embodiment, the malfunction of a variable capacitance circuit 50 due to a large voltage amplitude is prevented and the variable capacitance circuit 50 according to this embodiment is further applied to a low power supply voltage.

Figure 3:
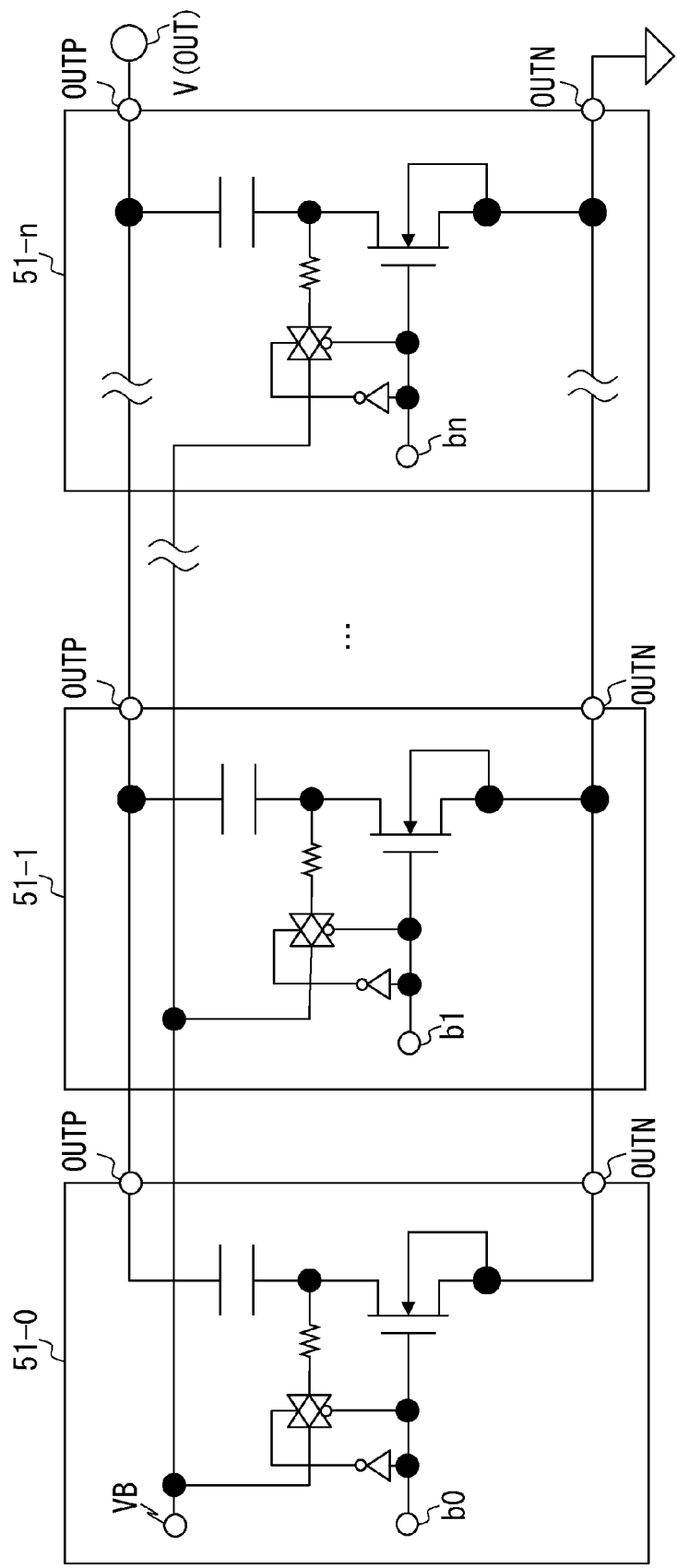
FIG. 3 is a diagram showing a whole configuration diagram of a digital variable capacitance circuit according to a comparative example.

FIG. 3 shows a whole configuration of the variable capacitance circuit 50 according to a comparative example. In the variable capacitance circuit 50, n unit capacities 51 are connected in parallel. The symbol n is an integer equal to or larger than two. FIG. 3 shows a configuration in which unit capacity cells 51-0 to 51-n are connected in parallel between two output terminals OUTP and OUTN. The capacitance value of the variable capacitance circuit 50 is a combined capacitance value of the plurality of unit capacity cells 51-0 to 51-n connected in parallel.

In FIG. 3, the output terminals of the respective unit capacity cells 51-0 to 51-n are denoted by the output terminals OUTP and OUTN. That is, the unit capacity cells 51-0 to 51-n have two common output terminals OUTP and OUTN. The output terminal OUTP corresponds to the RF output terminal 45a shown in FIG. 2 and the output terminal OUTN corresponds to the RF output terminal 45b. Since each of the unit capacity cells 51-0 to 51-n has a single ended output, the output terminal OUTN is connected to the ground. A digital enable control signal (hereinafter it will be simply referred to as a control signal) is input to control input terminals b0-bn of the respective unit capacity cells 51-0 to 51-n.

Figure 4:
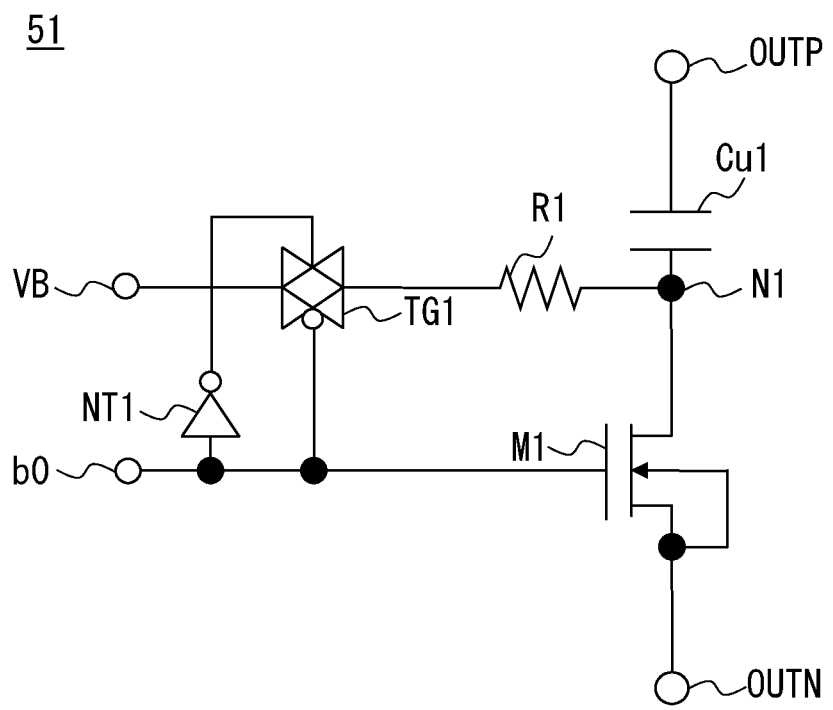
FIG. 4 is a circuit diagram showing a unit capacity cell of the digital variable capacitance circuit shown in FIG. 3.

The plurality of unit capacity cells 51-0 to 51-n are independently controlled by the control signal. Therefore, the whole capacitance value of the variable capacitance circuit 50 becomes variable. The unit capacity cells 51-0 to 51-n have the same configuration except for the control signal to be input thereto. FIG. 4 shows a configuration of the unit capacity cell 51. While the configuration of the unit capacity cell 51-0 including the control input terminal b0 is shown in FIG. 4, the other unit capacity cells 51-1 to 51-n also have a configuration the same as that of the unit capacity cell 51-0. Therefore, a description of the configuration of the unit capacity cells 51-1 to 51-n will be omitted.

As shown in FIG. 4, the unit capacity cell 51 includes a first capacitor Cu1, an NMOS (Metal Oxide Semiconductor) transistor M1, a resistor R1, a transmission gate TG1, and a NOT circuit NT1. The NMOS transistor M1 and the transmission gate TG1 each serve as a switch.

The first capacitor Cu1 and the NMOS transistor M1 are connected in series between the output terminal OUTP and the output terminal OUTN. Specifically, one end of the first capacitor Cu1 is connected to the output terminal OUTP. The other end of the first capacitor Cu1 is connected to the drain terminal of the NMOS transistor M1. The source terminal of the MMOS switch M1 is connected to the output terminal OUTN. The terminal between the first capacitor Cu1 and the NMOS transistor M1 is denoted by a first intermediate terminal N1.

The control input terminal b0 is connected to the gate terminal of the NMOS transistor M1. The control signal to make the capacitance value of the variable capacitance circuit 50 variable is connected to the control input terminal b0. Therefore, the NMOS transistor M1 serves as a switch that is turned on or off by the control signal.

Further, a bias voltage input terminal VB is connected to the first intermediate terminal N1 via the transmission gate TG1 and the resistor R1. The first intermediate terminal N1 is connected to the drain terminal of the NMOS transistor M1. Further, the negative control terminal of the transmission gate TG1 is connected to the control input terminal b0. The positive control terminal of the transmission gate TG1 is connected to the output of the NOT circuit NT1. The control terminal b0 is connected to the input side of the NOT circuit NT1.

Therefore, the ON/OFF of the transmission gate TG1 is controlled by the control signal. When the transmission gate TG1 is turned on, a bias voltage is supplied to the first intermediate terminal N1 and the drain terminal of the NMOS transistor M1 via the resistor R1.

When the control signal input to the control input terminal b0 is H, the switch resistance of the NMOS transistor M1 becomes zero and the state of the transmission gate TG1 becomes a high-impedance state. The unit capacity cell 51 is therefore in an on (active) state and the capacitance value of the unit capacity cell 51 becomes equal to the capacitance value (hereinafter it will be denoted by Cu) of the first capacitor Cu1. When the control signal is L, the switch resistance of the NMOS transistor M1 becomes infinite, the transmission gate TG1 is shorted out, and the drain DC voltage of the NMOS transistor M1 becomes the bias voltage. The unit capacity cell 51 is therefore in an OFF state.

Figure 5:
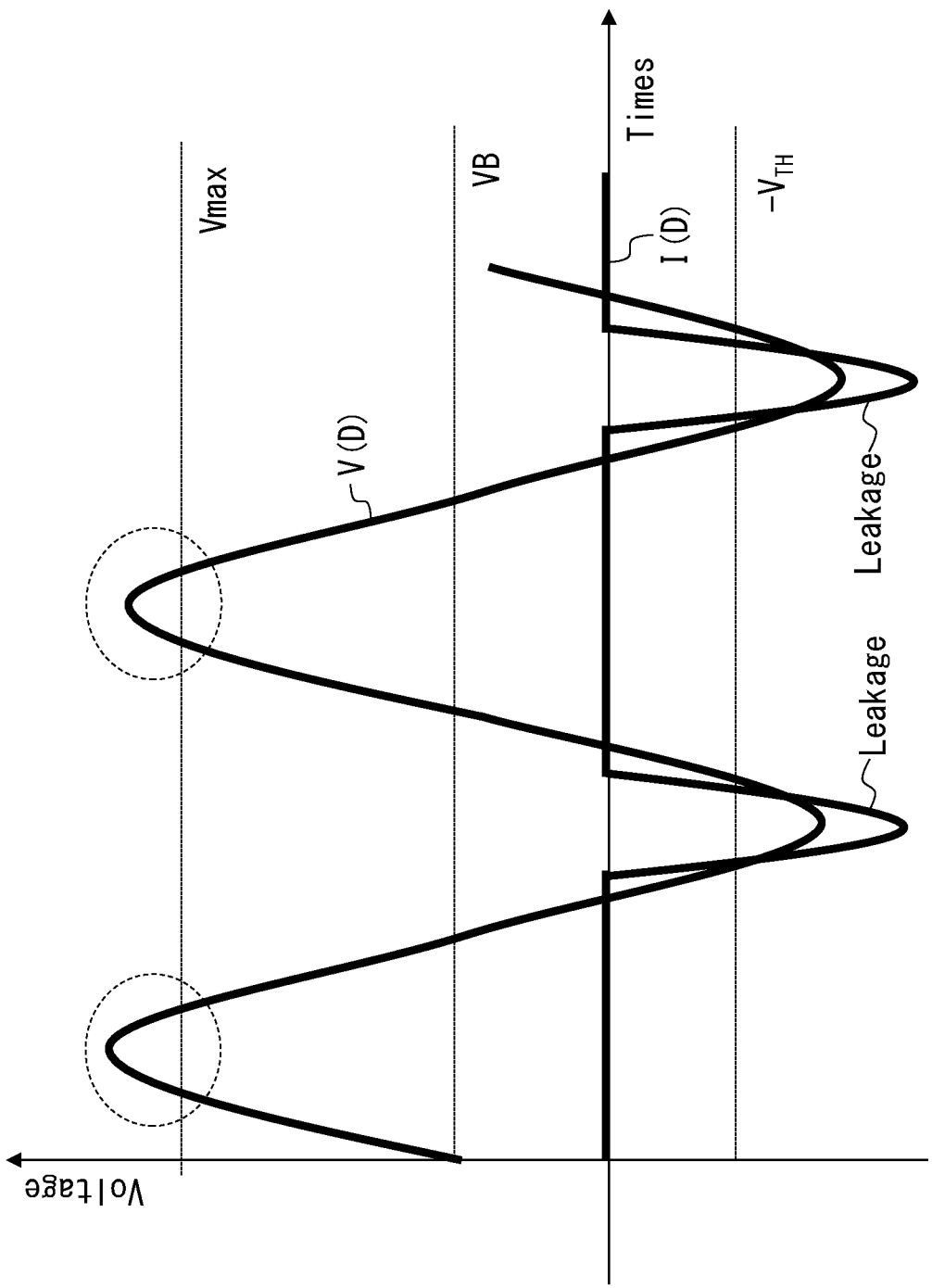
FIG. 5 is a diagram showing a current-voltage waveform when a transistor M1 is in an off state.

When a large voltage amplitude is applied to the output terminals OUTP and OUTN in a state in which the unit capacity cell 51 is in the off state, the NMOS transistor M1 may malfunction and thus a breakdown voltage specification may not be satisfied. FIG. 5 shows image diagrams of a voltage waveform and a current waveform applied to the drain terminal of the NMOS transistor M1 in the OFF state.

When the state of the unit capacity cell 51 becomes the OFF state, the voltage amplitude applied to the variable capacitance circuit 50 is applied to the drain voltage of the NMOS transistor M1 as it is. This is because, since the OFF resistance of the NMOS transistor M1 is infinite, the voltage is not divided and is propagated as it is. At this time, the drain voltage V(D) of the NMOS transistor M1 is shown by the following Expression (2).

$$VB+Vrf \geq V(D) \geq VB-Vrf \qquad (2)$$

The symbol Vrf denotes a voltage amplitude. Now, the voltage operating range of the drain voltage of the NOMS switch M1 will be discussed. The maximum value of the drain voltage of the NMOS switch M1 is determined by an element breakdown voltage Vmax of the off transistor. On the other hand, the minimum value of the drain voltage of the NMOS transistor M1 is determined under the condition that the malfunction in which the NMOS transistor M1 becomes ON does not occur. When a threshold voltage of the NMOS switch M1 that is used is denoted by $V_{TH}$, the minimum value of the drain voltage of the NMOS transistor M1 becomes $-V_{TH}$. Therefore, the voltage operating range of the drain voltage of the NMOS transistor M1 is expressed by the following Expression (3).

$$V\max \geq V(D) \geq -V_{TH} \qquad (3)$$

In order to satisfy Expression (3) and to make the voltage amplitude maximum, the bias voltage VB and the allowable maximum voltage amplitude Vrf need to be set as shown in the following Expressions (4) and (5).

$$VB=1/2(V\max-V_{TH}) \qquad (4)$$

$$Vrf=1/2(V\max+V_{TH}) \qquad (5)$$

Consider a case, for example, in which the variable capacitance circuit 50 shown in FIGS. 3 and 4 is applied as the capacitor C1 shown in FIG. 2 and the RFIC 100 outputs the power of 15.5 dBm. It is assumed, at this time, that the breakdown voltage specification when the NMOS transistor M1 is in the off state is 2.0 V and the threshold voltage $V_{TH}$ is 0.3 V. From Expressions (4) and (5), the bias voltage VB becomes 0.85 V and the allowable maximum voltage amplitude becomes 1.15 V peak voltage.

As described above, when the output power is 15.5 dBm, the voltage amplitude on the end of RFOUT is 1.88 V peak voltage. At this time, from Expression (2), the maximum voltage is 2.73 V and the minimum voltage is −1.03 V. This therefore causes the element breakdown voltage of the NMOS transistor M1 and the malfunction of the switch when it is in the off state.

In order to perform a high output transmission in the above variable capacitance circuit, it is possible to use a high breakdown voltage MOS transistor for the NMOS transistor M1. When the high breakdown voltage MOS transistor is used, the element breakdown voltage of the transistor and the threshold voltage are higher than those when a thin-film MOS transistor is used.

When the breakdown voltage of the high breakdown voltage MOS transistor is 4.1 V and the threshold voltage is 0.5 V, for example, the bias voltage VB becomes 1.8 V and the allowable maximum voltage amplitude has a 2.3 V peak voltage. By using the high breakdown voltage MOS transistor, the RFIC 100 is able to transmit the power of 15.5 dBm. When the power supply voltage becomes equal to or smaller than 1.8 V, however, it becomes impossible to generate the bias voltage VB, whereby it becomes quite difficult to reduce the power supply voltage. That is, it becomes impossible to use a 1.6 V alkaline battery.

Therefore, in the variable capacitance circuit according to the comparative example, it is difficult to achieve both the high transmission output of 15.5 dBm and the low power supply voltage operation. It is required to provide a new circuit configuration that normally operates under such conditions. By using the variable capacitance circuit according to this embodiment, it is possible to provide a communication apparatus capable of achieving both the high transmission output and the low power supply voltage operation.

Figure 6:
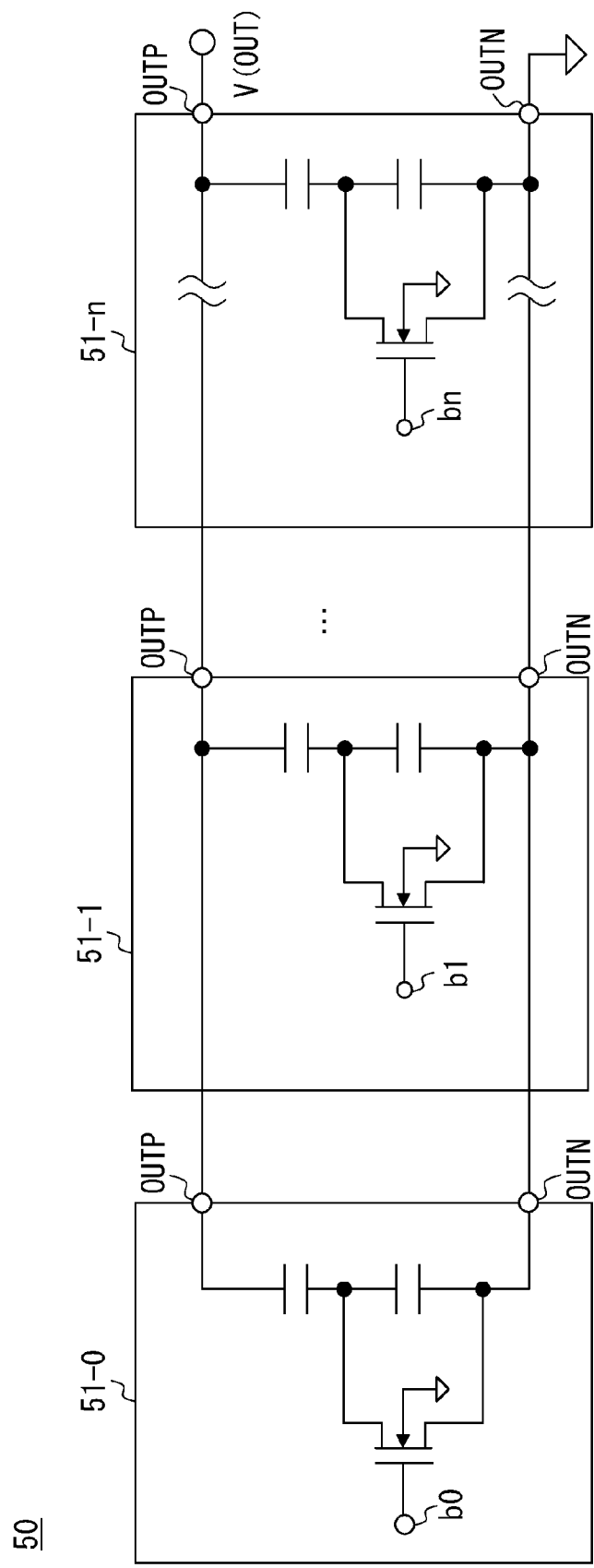
FIG. 6 is a circuit diagram of a digital variable capacitance circuit according to a first embodiment.
Figure 7:
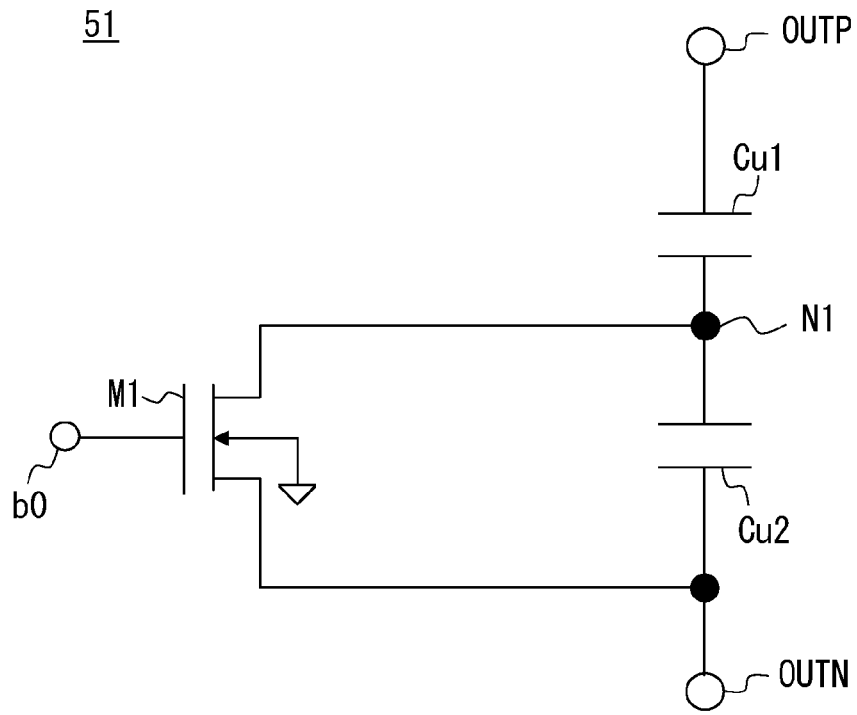
FIG. 7 is a circuit diagram showing a unit capacity cell of the digital variable capacitance circuit shown in FIG. 6.

With reference to FIGS. 6 and 7, the variable capacitance circuit according to this embodiment will be described. FIG. 6 is a circuit diagram schematically showing a configuration of the variable capacitance circuit 50. FIG. 7 is a circuit diagram showing a configuration of the unit capacity cell 51. In the following description, an example in which the variable capacitance circuit 50 is the capacitor C1 shown in FIG. 2 will be described.

As shown in FIG. 6, the variable capacitance circuit 50 includes a plurality of unit capacity cells 51-0 to 51-n. The plurality of unit capacity cells 51-0 to 51-n are connected in parallel between two output terminals OUTP and OUTN. The capacitance value of the variable capacitance circuit 50 is a combined capacitance value of the plurality of unit capacity cells 51-0 to 51-n that are connected in parallel.

In FIG. 6, the output terminals of each of the unit capacity cells 51-0 to 51-n are indicated by the output terminals OUTP and OUTN. That is, the unit capacity cells 51-0 to 51-n have two common output terminals OUTP and OUTN.

The output terminal OUTP corresponds to the RF output terminal 45a shown in FIG. 2 and the output terminal OUTN corresponds to the RF output terminal 45b. Therefore, an output voltage V (OUT) of the balun 48 is supplied to the output terminal OUTP. The output terminal OUTN is connected to the ground. A digital enable control signal (hereinafter it will be simply referred to as a control signal) is input to respective control input terminals b0 to bn of the respective unit capacity cells 51-0 to 51-n.

The plurality of unit capacity cells 51-0 to 51-n are independently controlled by the control signal. Therefore, the whole capacitance value of the variable capacitance circuit 50 becomes variable. The unit capacity cells 51-0 to 51-n have the same configuration except for the control signal to be input thereto. FIG. 7 shows the configuration of the unit capacity cell 51. While the configuration of the unit capacity cell 51-0 including the control input terminal b0 is shown in FIG. 7, the other unit capacity cells 51-1 to 51-n have a configuration the same as that of the unit capacity cell 51-0. Therefore, a descriptions of the configuration of the unit capacity cells 51-1 to 51-n will be omitted.

As shown in FIG. 7, the unit capacity cell 51 includes a first capacitor Cu1, a second capacitor Cu2, and an NMOS transistor M1. The NMOS transistor M1 serves as a switch.

The first capacitor Cu1 and the second capacitor Cu2 are connected in series between the output terminal OUTP and the output terminal OUTN. Specifically, one end of the first capacitor Cu1 is connected to the output terminal OUTP and the other end of the first capacitor Cu1 is connected to one end of the second capacitor Cu2. The other end of the second electrode Cu2 is connected to the output terminal OUTN. The terminal between the first capacitor Cu1 and the second capacitor Cu2 is referred to as a first intermediate terminal N1.

The NMOS transistor M1 and the second capacitor Cu2 are connected in parallel between the first intermediate terminal N1 and the output terminal OUTN. Specifically, the drain terminal of the NMOS transistor M1 is connected to the first intermediate terminal N1. The source terminal of the NMOS transistor is connected to the output terminal OUTN. Therefore, the source terminal of the NMOS transistor is connected to the other end of the second capacitor Cu2.

The gate terminal of the NMOS transistor M1 is connected to the control input terminal b0. The control signal is input to the control input terminal b0. Therefore, the NMOS transistor M1 serves as a switch that is turned on or off by the control signal.

When the unit capacity cell 51 is in the off (inactive) state, the drain voltage applied to the NMOS transistor M1 is capacitively divided. It is therefore possible to attenuate the voltage. Now, an active operation of the unit capacity cell will be described. When the control signal input to the control input terminal b0 is H, the switch resistance of the NMOS transistor M1 becomes zero. Accordingly, the unit capacity cell 51 is in the on (active) state. Therefore, the whole capacitance value of the unit capacity cell 51 becomes equal to a capacitance value Cu of the first capacitor Cu1.

When the control signal is L, the NMOS transistor M1 becomes OFF and the switch resistance of the NMOS transistor M1 becomes infinite. The unit capacity cell 51 is therefore in the off (inactive) state. The capacitance value of the unit capacity cell 51 becomes the combined capacitance value of two series capacitances. When the capacitance value of the first capacitor Cu1 is denoted by Cu and the capacitance value of the second capacitor Cu2 is denoted by M·Cu, the capacitance value of the unit capacity cell 51 becomes M/(1+M)·Cu. That is, the capacitance value of the unit capacity cell 51 becomes a series combined capacitance of the first capacitor Cu1 and the second capacitor Cu2.

When the voltage applied to the unit capacity cell 51 is denoted by V(OUT), the drain voltage V(D) of the NMOS transistor M1 is expressed by the following Expression (6).

$$V(D) = \frac{1}{1+M} \cdot V(OUT) \quad (6)$$

As described above, the voltage V(D) that has been capacitively divided is output to the drain terminal. In the comparative example, V (OUT) is directly output to the drain terminal. Therefore, in the variable capacitance circuit 50 according to the first embodiment, the voltage applied to the NMOS transistor M1 can be suppressed. It is therefore possible to prevent the malfunction of the switch of the NMOS transistor M1. Further, it is possible to use the element having a low breakdown voltage as the NMOS transistor M1. It is therefore possible to form the NMOS transistor M1 by the thin-film MOS transistor. It is therefore possible to reduce the power supply voltage. It is therefore possible to drive the RFIC 100 by the alkaline battery.

Figure 8:
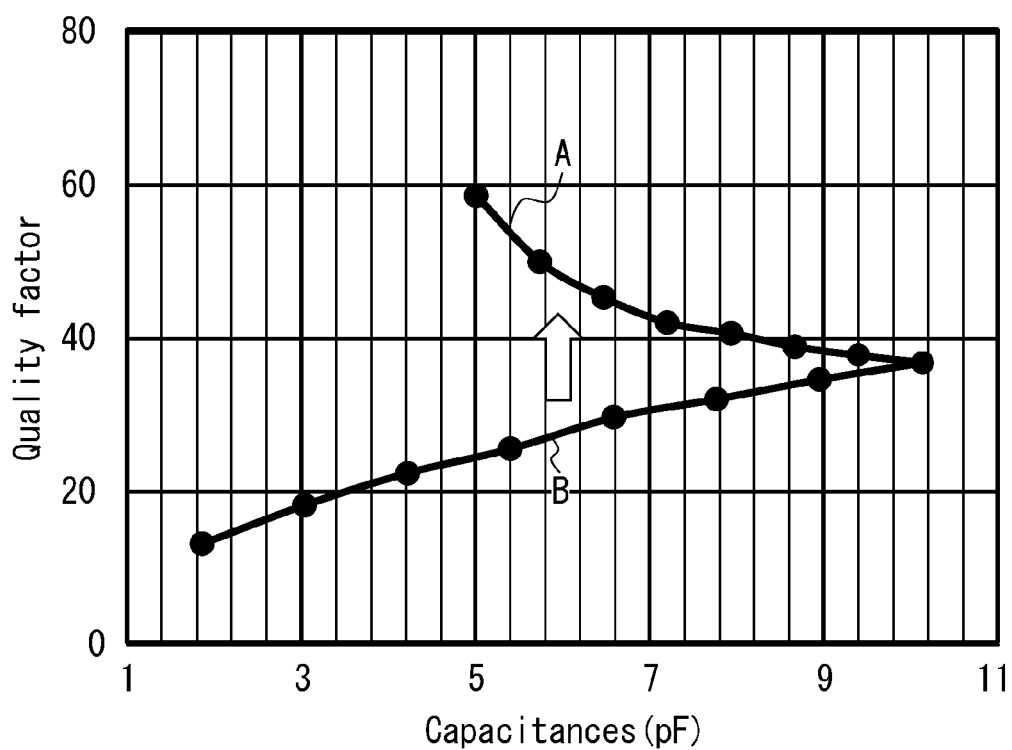
FIG. 8 is a diagram showing simulation results obtained by comparing capacity performances of digital variable capacitance circuits.

Another advantage of the configuration according to the first embodiment will be described. The Quality factor, which is one capacity performance of the capacitance circuit, is greater than that in the comparative example. FIG. 8 shows simulation results of the Quality factor and the combined capacitance value of the variable capacitance circuit 50 in the first embodiment and in the comparative example. In FIG. 8, the horizontal axis indicates the combined capacitance value and the vertical axis indicates the Quality factor. In FIG. 8, the simulation results of the first embodiment are indicated by A and the simulation results of the comparative example are indicated by B. FIG. 8 shows simulation results of a three-bit variable capacitance circuit. Further, a maximum combined capacitance value is fixed.

It is seen from FIG. 8 that the Quality factor performance in the configuration of the embodiment is better than that in the comparative example. When the capacity is small, in particular, the Quality factor performance in the former is significantly better than that in the latter. This is because the switch resistance of the NMOS transistor M1 when it is in the off state is finite and the Quality factor strongly depends on the resistance component. Now, the Quality factor when all the unit capacity cells 51 of the three-bit variable capacitance circuit 50 are OFF will be obtained.

The switch resistance when the NMOS transistor M1 is in the off state is denoted by $R_{OFF}$. When the Quality factor in the configuration of the comparative example is denoted by $Q_{CONV}$, the following Expression (7) is obtained.

$$Q_{conv} = \frac{1}{\omega \cdot C_u \cdot R_{OFF}} \quad (7)$$

In a similar way, when the Quality factor of the configuration of the first embodiment is denoted by $Q_{prop1}$, the following Expression (8) is obtained.

$$Q_{prop1} = \frac{1 + 2 \cdot (\omega \cdot M \cdot C_u \cdot R_{OFF})^2}{\omega \cdot M \cdot C_u \cdot R_{OFF}} \quad (8)$$
$$= 2 \cdot (\omega \cdot M \cdot C_u \cdot R_{OFF})$$

Since $R_{OFF}$ is an OFF switch resistance, it has a high resistance. From Expressions (7) and (8), it can be seen that the Quality factor in the first embodiment is larger than that in the comparative example.

As described above, in this embodiment, the AC voltage applied to the drain terminal of the NMOS transistor M1 is 1/(1+M) times larger than the output AC voltage. It is therefore possible to reduce the voltage amplitude in the drain terminal. It is therefore possible to achieve a high output transmission and to prevent the malfunction of the variable capacitance circuit. Further, it is possible to reduce the leak current when the NMOS transistor M1 is in the off state. Even when the variable capacitance circuit 50 having a small capacitance is used, the Quality factor performance can be improved. As described above, according to this embodiment, it is possible to provide the variable capacitance circuit 50 having a high performance.

It is possible to use the variable capacitance circuit 50 according to this embodiment in the capacitor C1 and the capacitor C2 shown in FIG. 2. According to the above configuration, there is no need to use the high breakdown voltage element as the NMOS transistor M1 also in the RFIC 100 that outputs a large voltage amplitude. It is therefore possible to form the NMOS transistor M1 by the thin-film MOS transistor having a low breakdown voltage. Since the thin-film MOS transistor the same as the main circuit can be used, there is no need to provide an additional power supply and an additional voltage source circuit.

Second Embodiment

Figure 9:
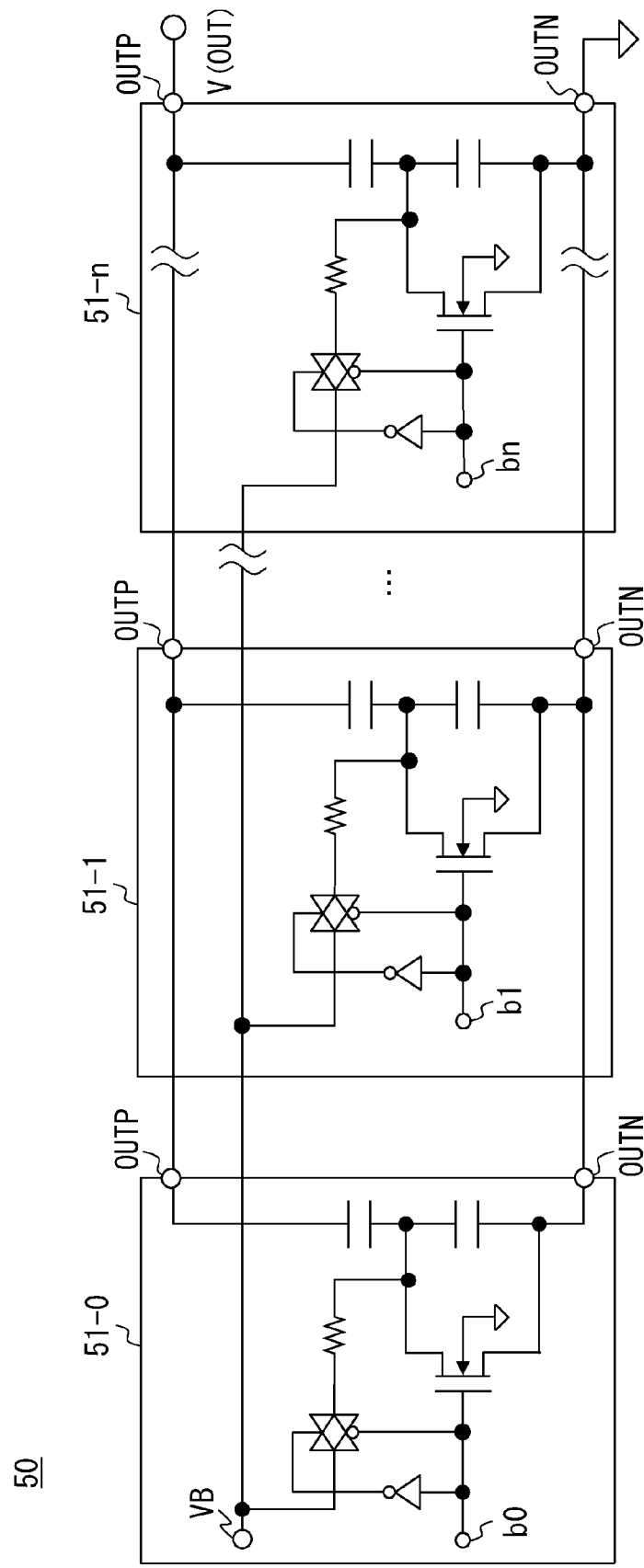
FIG. 9 is a circuit diagram of a digital variable capacitance circuit according to a second embodiment.
Figure 10:
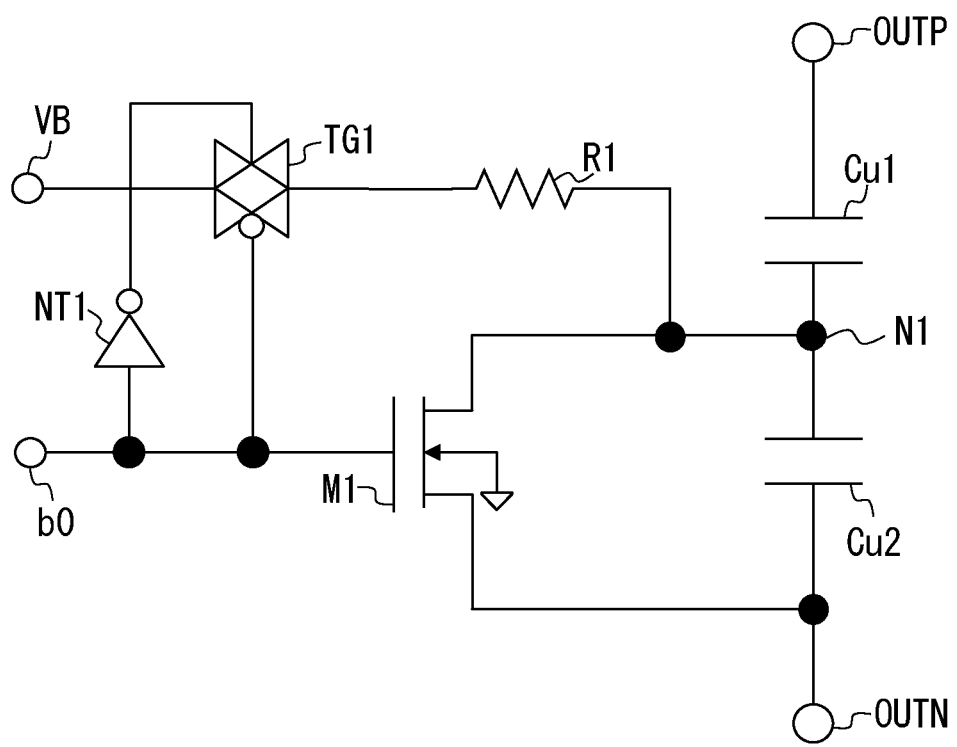
FIG. 10 is a circuit diagram showing a unit capacity cell of the digital variable capacitance circuit shown in FIG. 9.

With reference to FIGS. 9 and 10, a variable capacitance circuit 50 according to this embodiment will be described. FIG. 9 is a circuit diagram showing a configuration of the variable capacitance circuit 50 and FIG. 10 is a circuit diagram showing a configuration of a unit capacity cell 51 of the variable capacitance circuit 50.

In the second embodiment, a resistor R1, a transmission gate TG1, a NOT circuit NT1, and a bias voltage input terminal VB are added to the unit capacity cell 51 shown in FIG. 7. Since the basic configurations of the variable capacitance circuit 50 and the unit capacity cell 51 are similar to those in the first embodiment, descriptions thereof will be omitted.

The bias voltage input terminal VB is connected to the first intermediate terminal N1 via the transmission gate TG1 and the resistor R1. The first intermediate terminal N1 is a terminal between the first capacitor Cu1 and the second capacitor Cu2. The bias voltage input terminal VB is connected to the transmission gate TG1. Therefore, the bias voltage is input to the transmission gate TG1. One end of the resistor R1 is connected to the output of the transmission gate TG1 and the other end of the resistor R1 is connected to the first intermediate terminal N1. Therefore, the output side of the transmission gate TG1 is connected to the drain terminal of the NMOS transistor M1 via the resistor R1.

The negative control terminal of the transmission gate TG1 is connected to the control input terminal b0. The positive control terminal of the transmission gate TG1 is connected to the output of the NOT circuit NT1. The control terminal b0 is connected to the input side of the NOT circuit NT1. Therefore, the transmission gate TG1 serves as a switch that is turned on or off by a control signal. When the transmission gate TG1 is turned on, the bias voltage is supplied to the first intermediate terminal N1 and to the drain terminal of the NMOS transistor M1 via the resistor R1.

Next, the active operation of the unit capacity cell 51 will be described. When the unit capacity cell 51 shown in FIG. 10 is in the on (active) state, the NMOS transistor M1 is in the on state and the switch resistance becomes zero. In this case, the control signal of the control input terminal b0 is H and the output of the NOT circuit NT1 is L. Therefore, the transmission gate TG1 is in the high-impedance state. The bias voltage is not supplied to the drain terminal of the NMOS transistor M1. Therefore, the capacitance value of the unit capacity cell 51 is Cu.

On the other hand, when the unit capacity cell is in the off (inactive) state, the NMOS transistor M1 is in the off state and the switch resistance becomes infinite. In this case, the control signal of the control input terminal b0 is L and the output of the NOT circuit NT1 is H. Therefore, the transmission gate TG1 is in the conduction state. Therefore, the bias voltage is supplied to the drain terminal of the NMOS transistor M1. Therefore, the capacitance value of the unit capacity cell 51 becomes a combined capacitance of the two series capacitances. That is, the capacitance value of the unit capacity cell 51 becomes M/(1+M)·Cu.

In the configuration according to the second embodiment, when the unit capacity cell 51 is in the off state, the level of the drain potential of the NMOS transistor M1 is shifted by the amount corresponding to the bias voltage. It is therefore possible to accept the amplitude larger than that in the first embodiment. In the following description, the drain voltage when the unit capacity cell 51 is turned off will be considered.

The DC bias voltage becomes VB and the signal voltage amplitude becomes the amplitude in which the voltage is attenuated compared to that shown by Expression (6). When the voltage amplitude applied to the variable capacitance circuit 50 is denoted by Vrf, the following Expression (9) is obtained.

$$VB + \frac{1}{1+M} \cdot Vrf \geq V(D) \geq VB - \frac{1}{1+M} \cdot Vrf \quad (9)$$

Similar to the comparative example, the bias voltage and the allowable maximum voltage amplitude to make the voltage amplitude maximum are obtained. The maximum value of the drain voltage of the NMOS transistor M1 is determined by the element breakdown voltage Vmax of the OFF transistor. On the other hand, the minimum value of the drain voltage of the NMOS transistor M1 is determined under the condition that the malfunction in which the MOS switch becomes ON does not occur and becomes $-V_{TH}$. Therefore, with the use of Expression (9), the maximum amplitude and the bias voltage are respectively expressed by the following Expressions (10) and (11).

$$Vrf = \frac{1+M}{2}(V\max + V_{TH}) \quad (10)$$

$$VB = \frac{1}{2}(V\max - V_{TH}) \quad (11)$$

The maximum amplitude according to the first embodiment becomes equal to the threshold voltage of the NMOS transistor M1. Therefore, in the second embodiment, from the expression (10), it is possible to accept the amplitude $(1+M)/2 \cdot (1+V\max/V_{TH})$ times larger than that in the first embodiment. Accordingly, it is possible to make the allowable voltage amplitude larger, whereby a higher output transmission can be performed.

Third Embodiment

Figure 11:
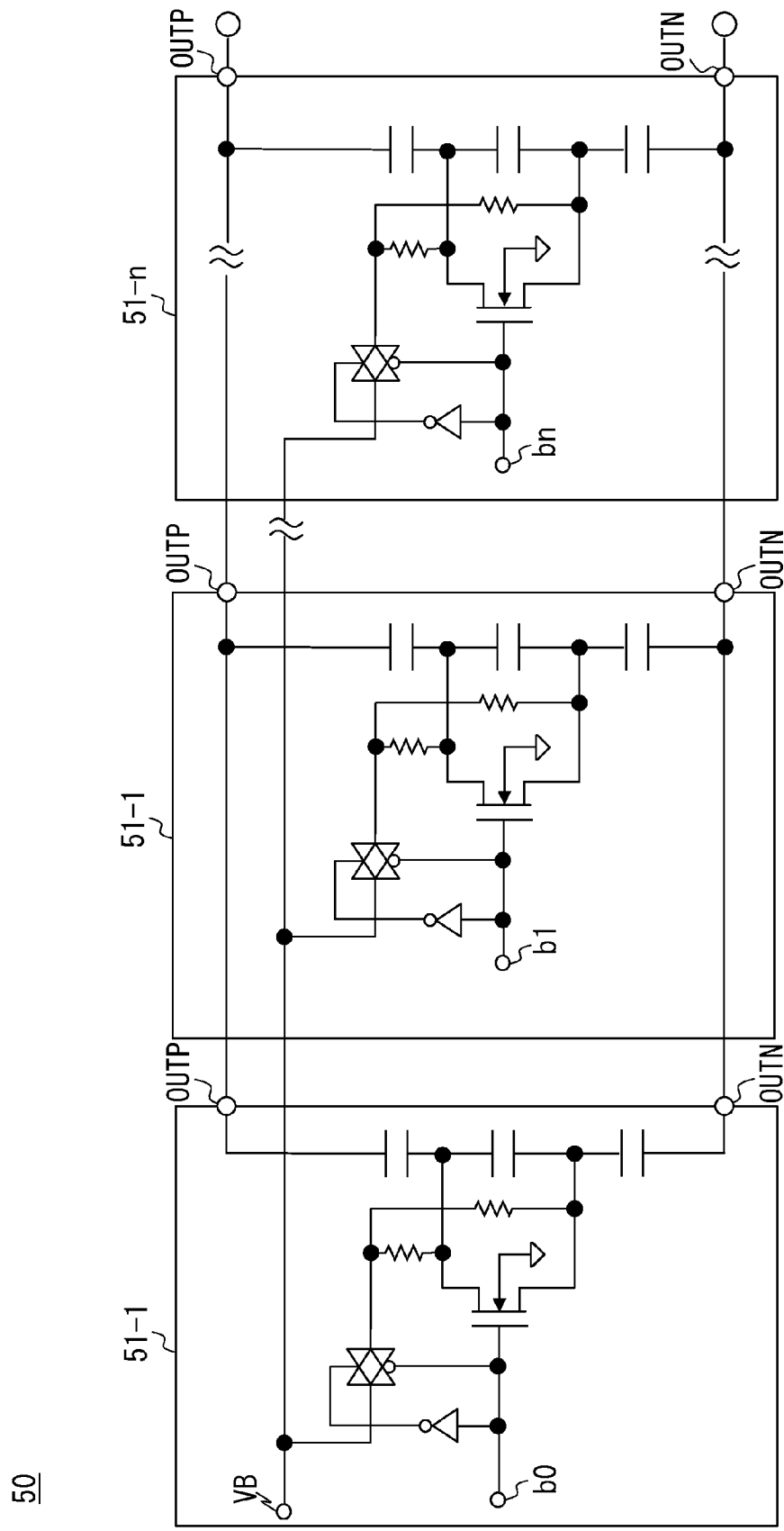
FIG. 11 is a circuit diagram showing a digital variable capacitance circuit according to a third embodiment.
Figure 12:
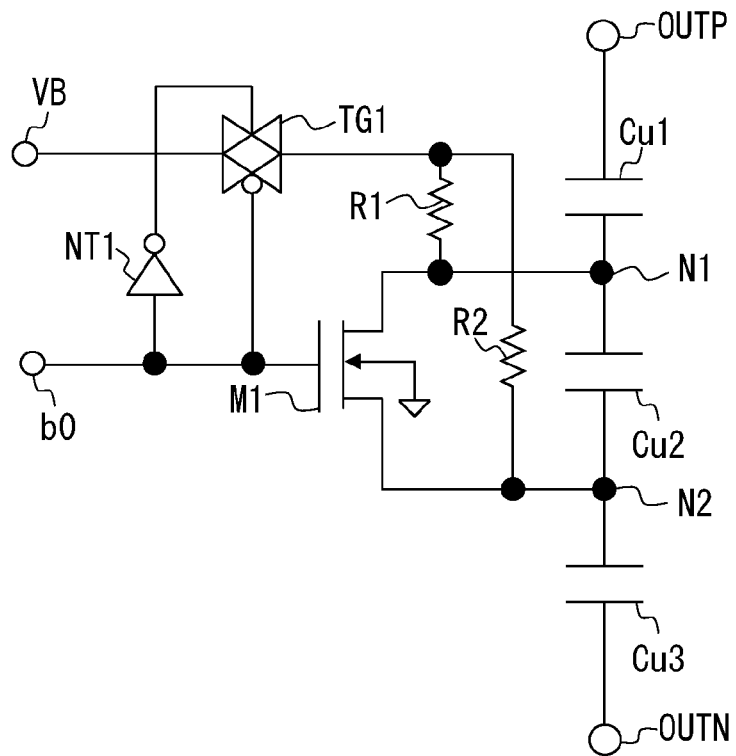
FIG. 12 is a circuit diagram showing a unit capacity cell of the digital variable capacitance circuit shown in FIG. 11.

With reference to FIGS. 11 and 12, a variable capacitance circuit 50 according to this embodiment will be described. FIG. 11 is a circuit diagram showing a configuration of the variable capacitance circuit 50 and FIG. 12 is a circuit diagram showing a configuration of a unit capacity cell 51 of the variable capacitance circuit 50.

The variable capacitance circuit 50 according to this embodiment is obtained by employing a differential capacitance in the variable capacitance circuit 50 according to the second embodiment. Therefore, the output terminal OUTN is not connected to the ground. That is, the output terminal OUTN is a negative differential output and the output terminal OUTP is a positive differential output.

Further, a first capacitor Cu1, a second capacitor Cu2, and a third capacitor Cu3 are connected in series between the output terminal OUTP and the output terminal OUTN. Further, a resistor R2 is added. Since the configuration other than the third capacitor Cu3 and the resistor R2 are similar to that of FIG. 10, a description thereof will be omitted.

The first capacitor Cu1 corresponds to the first capacitor Cu1 shown in FIG. 10 and the second capacitor Cu2 corresponds to the second capacitor Cu2 shown in FIG. 10. Accordingly, in the third embodiment, the third capacitor Cu3 is added to the output terminal OUTN side of the second capacitor Cu2.

Specifically, one end of the first capacitor Cu1 is connected to the output terminal OUTP and the other end of the first capacitor Cu1 is connected to one end of the second capacitor Cu2. One end of the third capacitor Cu3 is connected to the other end of the second capacitor Cu2 and the other end of the third capacitor Cu3 is connected to the output terminal OUTN. The terminal between the first capacitor Cu1 and the second capacitor Cu2 is referred to as a first intermediate terminal N1 and the terminal between the second capacitor Cu2 and the third capacitor Cu3 is referred to as a second intermediate terminal N2.

The NMOS transistor M1 is connected in parallel with the second capacitor Cu2. Therefore, the drain terminal of the NMOS transistor M1 is connected to the first intermediate terminal N1 and the source terminal thereof is connected to the second intermediate terminal N2.

The output of the transmission gate TG1 is connected to the second intermediate terminal N2 via the resistor R2. Therefore, when the transmission gate TG1 is turned on, the bias voltage is supplied to the second intermediate terminal N2 via the resistor R2.

The control terminal b0 is connected to the gate terminal of the NMOS transistor M1 and the input of the NOT circuit NT1. The bias voltage input terminal VB is connected to the drain terminal of the NMOS transistor M1 via the transmission gate TG1 and the resistor R1. Further, the bias voltage input terminal VB is connected to the source terminal of the NMOS transistor M1 via the transmission gate TG1 and the resistor R2. Further, the positive control terminal of the transmission gate TG1 is connected to the output of the NOT circuit NT1 and the negative control terminal thereof is connected to the control terminal b0.

The capacitance value of the first capacitor Cu1 and the third capacitor Cu3 is denoted by Cu and the capacitance value of the second capacitor Cut is denoted by $\frac{1}{2} \cdot M \cdot Cu$.

Next, a description will be given of an active operation according to the third embodiment. When the unit capacity cell 51 shown in FIG. 12 is in the on (active) state, the NMOS transistor M1 is in the on state and the switch resistance becomes zero. In this case, the control signal of the control terminal b0 is H and the output of the NOT circuit NT1 is L. Therefore, the transmission gate TG1 is in the high-impedance state. Therefore, the bias voltage input to the bias voltage input terminal VB is not supplied to the drain terminal of the NMOS transistor M1. The differential combined capacitance value of the unit capacity cell 51 becomes $1/2 \cdot Cu$. That is, the first capacitor Cu1 and the third capacitor Cu3 are connected in series via the NMOS transistor M1 which is in the ON state. Therefore, the serial combined capacitance value of the first capacitor Cu1 and the third capacitor Cu3 becomes the capacitance value of the unit capacity cell 51.

On the other hand, when the unit capacity cell is in the off (inactive) state, the NMOS transistor M1 is in the off state and the switch resistance becomes infinite. In this case, the control signal of the control terminal b0 is L and the output of the NOT circuit NT1 is H. Therefore, the transmission gate TG1 is in the conduction state. Therefore, the bias voltage is supplied to each of the drain terminal and the source terminal of the NMOS transistor M1 via the resistors R1 and R2. Therefore, the capacitance value of the unit capacity cell 51 becomes the serial combined capacitance value of the first capacitor Cu1, the second capacitor Cu2, and the third capacitor Cu3 and becomes $(M/(1+2M) \cdot Cu)$.

In this embodiment, the signal voltage between the drain and the voltage applied to the NMOS transistor M1 can be attenuated. When the unit capacity cell 51 shown in FIG. 12 is in the inactive state, the unit capacity cell 51 can be regarded as a circuit in which the first capacitor Cu1, the second capacitor Cu2, and the third capacitor Cu3 are connected in series. When the voltage applied to the variable capacitance circuit 50 is denoted by V (OUT), the voltage between the drain and the source has a value the same as that in Expression (6).

On the other hand, when a general differential variable capacitance circuit is used, the voltage between the drain and the source in the inactive state becomes V(OUT). Therefore, according to the configuration of the third embodiment, it is possible to attenuate the voltage signal between the drain and the source. It is therefore possible to prevent the element breakdown voltage of the transistor and the malfunction of the MOS switch.

While the variable capacitance circuit 50 according to this embodiment is obtained by employing the differential capacitance in the configuration of the second embodiment, it may be obtained by employing the differential capacitance in the configuration of the first embodiment. In the latter case, the third capacitor Cu3 is added to the configuration of FIG. 7. That is, the third capacitor Cu3 is arranged between the second capacitor Cu and the output terminal OUTN.

Fourth Embodiment

Figure 13:
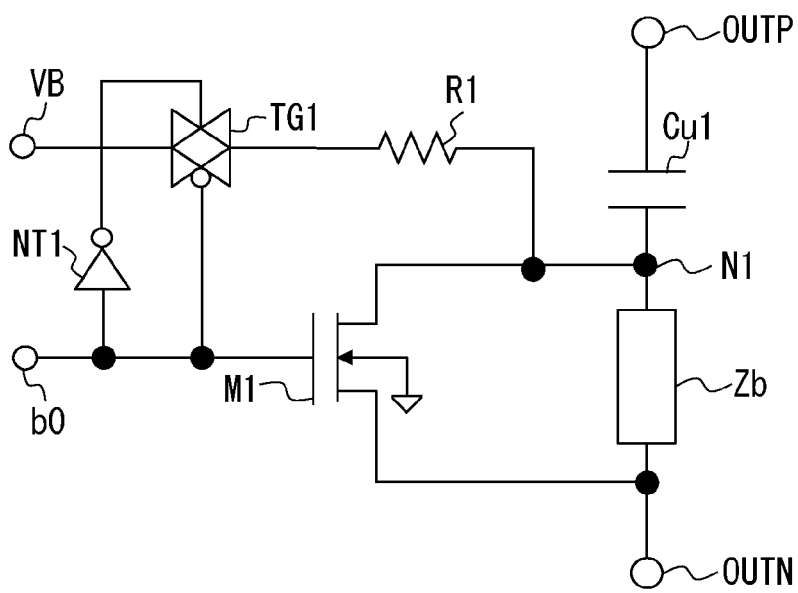
FIG. 13 is a circuit diagram showing a unit capacity cell of a digital variable capacitance circuit according to a fourth embodiment.

With reference to FIG. 13, a variable capacitance circuit according to this embodiment will be described. FIG. 13 is a circuit diagram showing a configuration of a unit capacity cell 51 of a variable capacitance circuit 50. In this embodiment, the second capacitor Cut of the unit capacity cell 51 according to the second embodiment is replaced by an impedance element Zb. Since the other configuration is similar to that in the second embodiment, a description thereof will be omitted.

The first capacitor Cu1 and the impedance element Zb are connected in series between the output terminal OUTP and the output terminal OUTN. Therefore, when the unit capacity cell 51 is in the off (inactive) state, the NMOS transistor M1 is turned off. Therefore, it can be said that the unit capacity cell 51 is a circuit in which the first capacitor Cu1 and the impedance element Zb are connected in series. Therefore, the drain terminal voltage of the NMOS transistor M1 is divided by the first capacitor Cu and the fixed impedance Zb and the voltage is attenuated. It is therefore possible to obtain the effect similar to that in the second embodiment.

The impedance element Zb may be, for example, a resistor. In a low-frequency analog circuit or the like, a resistor may be used as the impedance element Zb. While the second capacitor Cu2 according to the second embodiment has been replaced by the impedance element Zb in FIG. 13, the second capacitor Cu2 according to the first embodiment or the third embodiment may be replaced by the impedance element Zb.

The first to fourth embodiments stated above may be combined as appropriate.

Example to Which Variable Capacitance Circuit is Applied

While the example in which the variable capacitance circuit 50 is applied to the capacitor C1 of the HPA circuit 43 has been described in the above embodiments, the variable capacitance circuit 50 may also be applied to other capacitors. It is possible to apply the variable capacitance circuit 50, for example, to the capacitor C2 of the band reject filter 44 shown in FIG. 2.

Besides an amplification circuit, the variable capacitance circuit 50 can be used for a matching circuit, a load circuit, a front-end circuit, and a resonant circuit. The load circuit includes circuits, for example, provided after the amplifier 47 in FIG. 2. Therefore, one or a plurality of the capacitor C1 and the capacitor C2 may be the variable capacitance circuit 50. The front-end circuit includes the first-stage LNA circuit 24 and the circuits provided before the first-stage LNA circuit 24 in the receiver 20. For example, the internal matching circuit 23 shown in FIG. 1 is the front-end circuit.

The capacitor of the internal matching circuit 23 may be the variable capacitance circuit 50. It is therefore possible to solve the problem of the element breakdown voltage and to prevent the malfunction of the variable capacitance circuit.

Furthermore, the variable capacitance circuit 50 can be applied also to the balun resonant circuit. When the inductors L1 and L2 and the capacitor C1 shown in FIG. 2 are balun resonant circuits, for example, the variable capacitance circuit 50 can be used for the capacitor C1. Furthermore, the variable capacitance circuit 50 may be connected to the inductor L1 on the input side in parallel. Alternatively, the variable capacitance circuit 50 may be connected to both the inductor L1 and the inductor L2 in parallel. It is therefore possible to solve the problem of the element breakdown voltage and to prevent the malfunction of the variable capacitance circuit.

Further, the variable capacitance circuit 50 can be applied also to the serial resonant circuit in which the inductor and the capacitor are connected in series. When the inductor L3 and the capacitor C2 shown in FIG. 2 are serial resonant circuits, for example, the variable capacitance circuit 50 can be used for the capacitor C2. It is therefore possible to solve the problem of the element breakdown voltage and to prevent the malfunction of the variable capacitance circuit.

Further, the variable capacitance circuit 50 can be applied also to the parallel resonant circuit in which the capacitor and the inductor are connected in parallel. When the inductor L2 and the capacitor C1 shown in FIG. 2 are parallel resonant circuits, for example, the variable capacitance circuit 50 may be used as the capacitor C1. In the oscillation circuit, the parallel resonant circuit can be used as a load. In the oscillation circuit that uses the parallel resonant circuit as the load circuit, a large voltage amplitude can be output.

Further, the variable capacitance circuit 50 can be applied also to the LNA circuit 24 and the VCO circuit 42 including the system configuration that outputs a large voltage amplitude. Similar to the HPA circuit 43, it is possible to solve the problem of the element breakdown voltage and to prevent the malfunction of the variable capacitance circuit also in the LNA circuit 24 and the VCO circuit 42.

Figure 14:
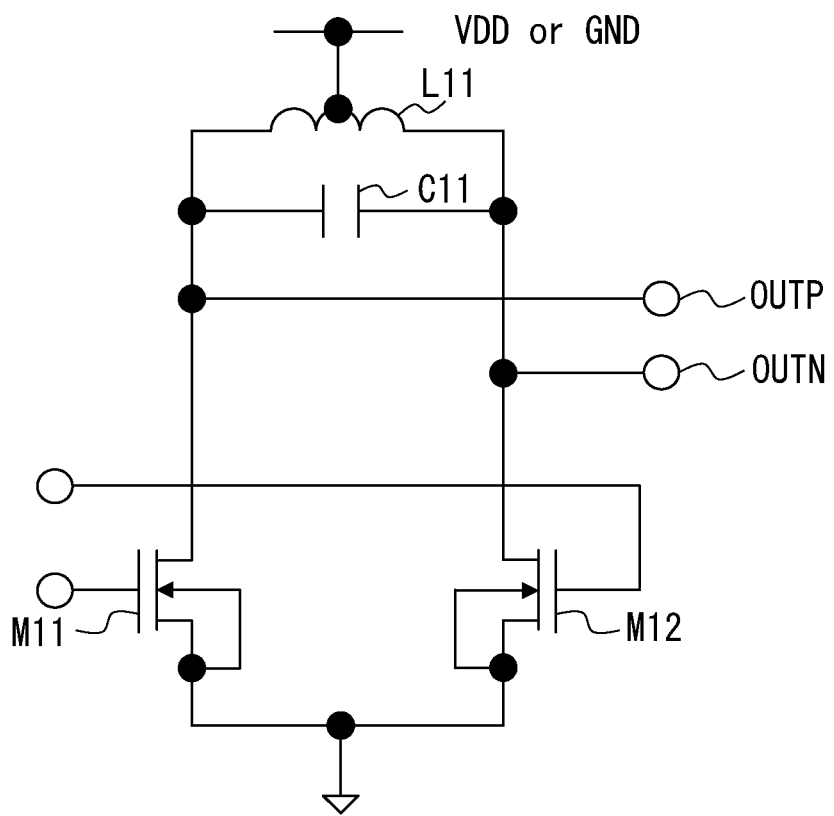
FIG. 14 is a circuit diagram showing an LNA circuit to which the digital capacitance circuit according to this embodiment is applied.

FIG. 14 shows a configuration example of the LNA circuit 24. The LNA circuit 24 includes an inductor L11, a capacitor C11, an NMOS transistor M11, and an NMOS transistor M12. The inductor L11 and the capacitor C11 are connected in parallel. Further, the drain terminal of the NMOS transistor M11 is connected to one end of the capacitor C11. Further, the drain terminal of the NMOS transistor M12 is connected to the other end of the capacitor C11. The source terminals of the NMOS transistors M11 and M12 are connected to the ground.

The output terminal OUTP is connected to one end of the capacitance element C11 and the output terminal OUTN is connected to the other end. The variable capacitance circuit 50 stated above can be used for such a capacitor C11 of the LNA circuit 24. When the LNA circuit 24 is a differential output, for example, the variable capacitance circuit 50 according to the third embodiment can be used for the capacitor C11.

Figure 15:
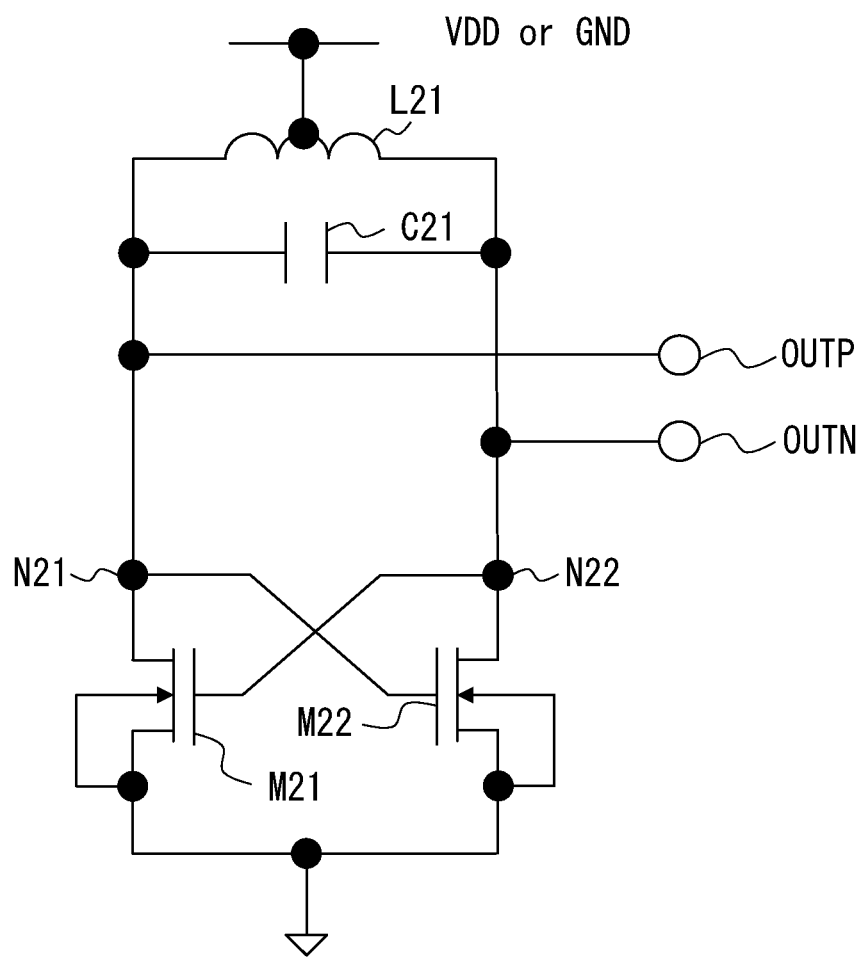
FIG. 15 is a circuit diagram showing a VCO circuit to which the digital capacitance circuit according to this embodiment is applied.

FIG. 15 shows a configuration example of the VCO circuit 42. The VCO circuit 42 includes an inductor L21, a capacitor C21, an NMOS transistor M21, and an NMOS transistor M22. The inductor L21 and the capacitor C21 are connected in parallel. Further, the drain terminal of the NMOS transistor M21 is connected to one end of the capacitor C21. Further, the drain terminal of the NMOS transistor M22 is connected to the other end of the capacitor C21. The source terminals of the NMOS transistors M21 and M22 are connected to the ground. Further, the gate terminal of the NMOS transistor M21 is connected to the intermediate terminal N22. The intermediate terminal N22 is a terminal which is provided between the drain terminal of the NMOS transistor M22 and the capacitor C21. The gate terminal of the NMOS transistor M22 is connected to the intermediate terminal N21. The intermediate terminal N21 is a terminal which is provided between the drain terminal of the NMOS transistor M22 and the capacitor C21.

The output terminal OUTP is connected to one end of the capacitance element C21 and the output terminal OUTN is connected to the other end thereof. The variable capacitance circuit 50 stated above can be used for the capacitor C21 of the VCO circuit 42. When the VCO circuit 42 is a differential output circuit, for example, the variable capacitance circuit 50 according to the third embodiment may be used as the capacitor C21.

As described above, the variable capacitance circuit 50 can be used for the capacitor used in various circuits such as a serial resonant circuit, a parallel resonant circuit, a balun resonant circuit, a load circuit, an oscillation circuit, a front-end circuit and the like. In this embodiment, it is possible to attenuate the signal voltage applied to the NMOS transistor M1 of the unit capacity cell 51. It is therefore possible to suppress the problems of the breakdown voltage of the NMOS transistor M1 and the leak current. It is possible to prevent the malfunction of the digital variable capacitor. A low breakdown voltage element having a low breakdown voltage can be used as the NMOS transistor M1. It is possible to output a large output amplitude. Further, it is possible to improve the capacity performance (Quality factor) compared to the case in which the high breakdown voltage MOS transistor is used for the NMOS transistor M1. Even in the case of the high output transmission, the high breakdown voltage MOS transistor may not be used, whereby it is possible to reduce the power supply voltage.

As described above, it is possible to provide the variable capacitance circuit 50 having a high performance. Further, the performance of various circuits such as the serial resonant circuit, the parallel resonant circuit, the balun resonant circuit, the load circuit, the oscillation circuit, and the front-end circuit can be improved. The variable capacitance circuit 50 is suitable for a transmitter in the radio communication. The variable capacitance circuit 50 is suitable for a battery-driven transmitter or the like since the power supply voltage of the variable capacitance circuit 50 can be decreased. Specifically, the variable capacitance circuit 50 is suitable for the RFIC used in the sub-GHz radio communication or the RFIC that complies with the BLE. That is, since the transmitter including the variable capacitance circuit 50 can be driven by the alkaline battery, economy can be improved.

(Configuration of MOS Transistor)

Figure 16:
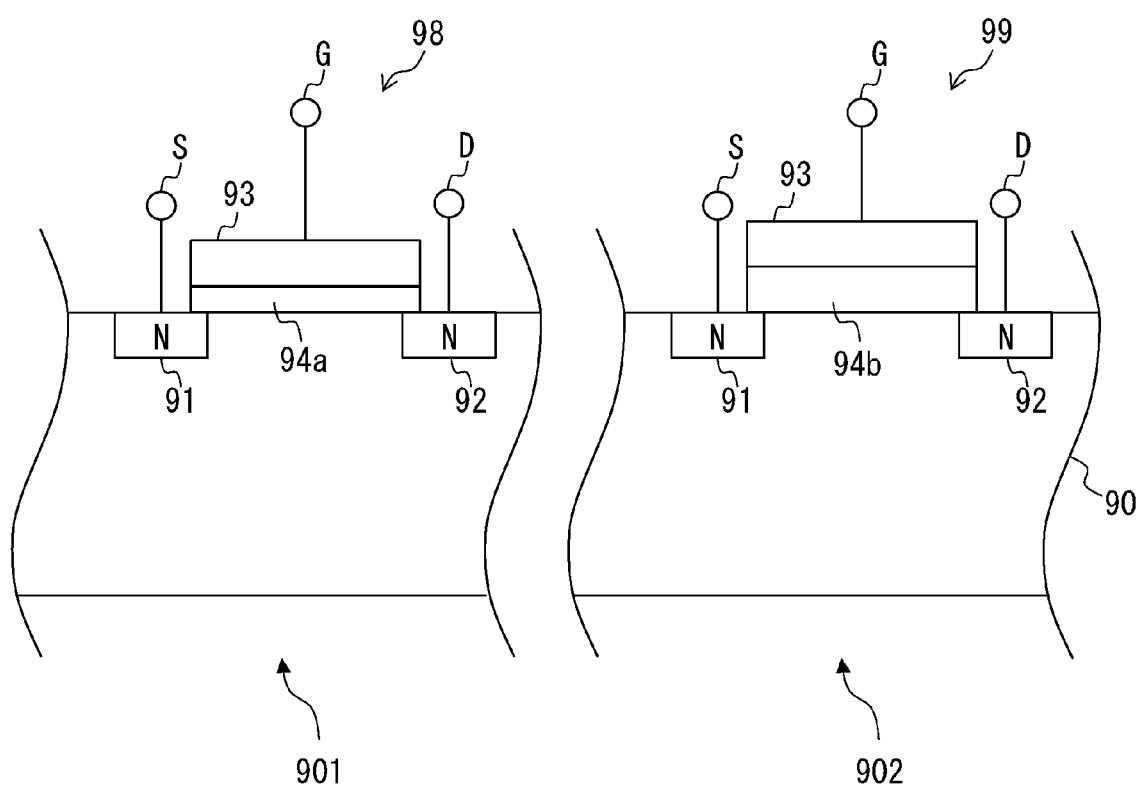
FIG. 16 is a diagram showing a cross-sectional configuration of a thick-film transistor and a thin-film transistor.

As described above, an element whose breakdown voltage is low can be used as the NMOS transistor M1. It is thus possible to use the thin-film transistor having a low breakdown voltage as the NMOS transistor M1. FIG. 16 shows a cross-sectional configuration of a thick-film transistor and a thin-film transistor.

As shown in FIG. 16, a thin-film transistor 98 and a thick-film transistor 99 are formed on a substrate 90. The thin-film transistor 98 is arranged in a thin-film transistor forming region 901. Further, the thick-film transistor 99, which is a high breakdown voltage MOS transistor, is arranged in a thick-film transistor forming region 902. The thin-film transistor 98 and the thick-film transistor 99 are MOS transistors and the thickness of the gate insulating film 94 varies between the thin-film transistor 98 and the thick-film transistor 99.

Each of the thin-film MOS transistor 98 and the thick-film transistor 99 includes an N-type source 91, an N-type drain 92, a gate 93, and a gate insulating film 94. The gate insulating film 94 is arranged on the substrate 90 between the source 91 and the drain 92. Further, the gate 93 is arranged on the gate insulating film 94. The gate insulating film of the thin-film MOS transistor 98 is referred to as a gate insulating film 94a and the gate insulating film of the thick-film MOS transistor 99 is referred to as a gate insulating film 94b.

The gate insulating film 94a is thinner than the gate insulating film 94b. Therefore, the breakdown voltage of the thin-film MOS transistor 98 is lower than that of the thick-film transistor 99. In other words, the thick-film transistor 99 is a high breakdown voltage element and the thin-film transistor 98 is a low breakdown voltage element. The NMOS transistor M1 of the variable capacitance circuit 50 is formed of the thin-film transistor 98.

Therefore, the circuit that uses the variable capacitance circuit 50 (e.g., transistors such as the HPA circuit 43, the VCO circuit 42, the LNA circuit 24 and the like shown in FIG. 2) can be formed of the thin-film transistor 98. It is therefore possible to reduce the power supply voltage and to drive the RFIC 100 by the alkaline battery (1.6 V). The variable capacitance circuit 50 is therefore suitable for the Sub-GHz RFIC that complies with IEEE 802.15.4 g and the RFIC that complies with the BLE. By using the variable capacitance circuit 50 for the communication apparatus 1, the communication apparatus 1 can be complied with the standards of various countries. Only the circuit that requires a high breakdown voltage (e.g., transistors of the band reject filter 44 and the internal matching circuit 23) may be formed of the thick-film transistor 98.

While the invention made by the present inventors has been specifically described based on the embodiments, it is needless to say that the present invention is not limited to the embodiments stated above and may be changed in various ways without departing from the spirit of the present invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A digital variable capacitance element, comprising
a plurality of capacity cells that are connected in parallel between two output terminals, wherein one of the capacity cells comprises:
a first capacitor having one end connected to one of the two output terminals;
an impedance element that is connected in series with the first capacitor between the two output terminals;
a transistor that is connected in parallel with the impedance element and is controlled in accordance with a digital control signal;
a bias voltage supply terminal that is supplied with a bias voltage;

a transmission gate connecting the bias voltage supply terminal to another end of the first capacitor and to a drain terminal of the transistor;
a control input terminal connected to a gate terminal of the transistor and to the transmission gate; and
a NOT circuit located between the transmission gate and the gate terminal of the transistor,
wherein the transmission gate is connected to an output of the NOT circuit, and the control terminal is connected to an input of the NOT circuit.

2. The digital variable capacitance circuit according to claim 1, wherein the impedance element comprises a second capacitor.

3. The digital variable capacitance circuit according to claim 1, further comprising:
a switch comprising the transmission gate that supplies the bias voltage to an intermediate terminal between the first capacitor and the impedance element in accordance with the digital control signal; and
a resistor arranged between the intermediate terminal and the bias voltage supply terminal.

4. The digital variable capacitance circuit according to claim 1, wherein the one of capacity cells further comprises a third capacitor,
wherein the first capacitor, the impedance element, and the third capacitor are connected in series in this order between the two output terminals, and
wherein a differential operation is performed by the two output terminals.

5. The digital variable capacitance circuit according to claim 4, further comprising:
a switch comprising the transmission gate that supplies the bias voltage to first and second intermediate terminals in accordance with the digital control signal;
a first resistor that is arranged between the first intermediate terminal and the bias voltage supply terminal; and
a second resistor that is connected between the second intermediate terminal and the bias voltage supply terminal,
wherein the first intermediate terminal comprises an intermediate terminal between the first capacitor and the impedance element, and
wherein the second intermediate terminal comprises an intermediate terminal between the third capacitor and the impedance element.

6. A balm resonant circuit, comprising:
the digital variable capacitance circuit according to claim 1;
a first inductor; and
a second inductor that is coupled with the first inductor,
wherein the digital variable capacitance circuit is connected in parallel with one of the first inductor and the second inductor.

7. A serial resonant circuit, comprising:
the digital variable capacitance circuit according to claim 1; and
an inductor that is connected in series with the digital variable capacitance circuit.

8. A parallel resonant circuit, comprising:
the digital variable capacitance circuit according to claim 1; and
an inductor that is connected in parallel with the digital variable capacitance circuit.

9. An oscillation circuit that uses the parallel resonant circuit according to claim 8 as a load.

10. An amplification circuit, comprising:
the balun resonant circuit according to claim 6.

11. A transmitter comprising the digital variable capacitance circuit according to claim 1.

12. The amplification circuit according to claim 10, further comprising:
an inductor that is connected in series with the digital variable capacitance circuit; and
another inductor that is connected in parallel with the digital variable capacitance circuit.

13. The digital variable capacitance circuit according to claim 1, wherein a positive control terminal of the transmission gate is connected to the output of the NOT circuit.

14. The digital variable capacitance circuit according to claim 13, wherein a negative control terminal of the transmission gate is connected to the control input terminal.

15. The digital variable capacitance circuit according to claim 3, wherein the bias voltage supply terminal is connected to the intermediate terminal via the transmission gate and the resistor.

16. The digital variable capacitance circuit according to claim 5, wherein the bias voltage supply terminal is connected to the first intermediate terminal via the transmission gate and the first resistor.

17. The digital variable capacitance circuit according to claim 16, wherein an output of the transmission gate is connected to the second intermediate terminal via the second resistor.

18. The digital variable capacitance circuit according to claim 17, wherein the bias voltage supply terminal is connected to a source terminal of the transistor via the transmission gate and the second resistor.

19. The digital variable capacitance circuit according to claim 18, wherein a positive control terminal of the transmission gate is connected to the output of the NOT circuit, and a negative control terminal of the transmission gate is connected to the control terminal.

20. The digital variable capacitance circuit according to claim 19, wherein the negative control terminal of the transmission gate is further connected to the gate terminal of the transistor.

* * * * *